(12) United States Patent
Dong et al.

(10) Patent No.: US 9,336,340 B1
(45) Date of Patent: May 10, 2016

(54) EVALUATING MANAGEMENT OPERATIONS

(75) Inventors: Dazhi Dong, Shanghai (CN); Scott E. Joyce, Foxboro, MA (US); Bruce R. Rabe, Dedham, MA (US); Xiaogang Wang, Shanghai (CN); Qi Qu, Shanghai (CN); Vincent Ma, Shanghai (CN)

(73) Assignee: EMC Corporation, Hopkinton, MA (US)

( * ) Notice: Subject to any disclaimer, the term of this patent is extended or adjusted under 35 U.S.C. 154(b) by 96 days.

(21) Appl. No.: 13/435,480

(22) Filed: Mar. 30, 2012

(51) Int. Cl.
| | |
|---|---|
| *G06F 17/50* | (2006.01) |
| *G06F 11/34* | (2006.01) |
| *G06F 3/06* | (2006.01) |
| *G06F 11/36* | (2006.01) |

(52) U.S. Cl.
CPC .......... *G06F 17/5009* (2013.01); *G06F 3/0653* (2013.01); *G06F 11/3457* (2013.01); *G06F 17/50* (2013.01); *G06F 11/366* (2013.01)

(58) Field of Classification Search
CPC ... G06F 17/50; G06F 17/5009; G06F 3/0605; G06F 3/0664; G06F 11/261; G06F 11/3457; G06F 11/366; G06F 3/0629; G06F 3/0653
See application file for complete search history.

(56) References Cited

U.S. PATENT DOCUMENTS

| | | | |
|---|---|---|---|
| 7,774,444 B1* | 8/2010 | George et al. | 709/223 |
| 2006/0129781 A1* | 6/2006 | Gellai et al. | 711/170 |
| 2010/0312540 A1* | 12/2010 | Jess | 703/21 |
| 2011/0231172 A1* | 9/2011 | Gold | 703/13 |
| 2012/0173215 A1* | 7/2012 | Buchan et al. | 703/6 |

* cited by examiner

*Primary Examiner* — Kevin Verbrugge
*Assistant Examiner* — Rocio Del Mar Perez-Velez
(74) *Attorney, Agent, or Firm* — Krishnendu Gupta; Jason A. Reyes

(57) ABSTRACT

Described is a method and system for use in evaluating management operations. A current storage configuration in connection with a data storage system is captured. A management operation event relating to the data storage system is simulated without affecting the data storage system. The management operation event is simulated using the current storage configuration in connection with the data storage system. A management operation event output is provided for enabling evaluation of the potential affect of the management operation event in the data storage system in response to simulating the management operation.

16 Claims, 5 Drawing Sheets

EVALUATING MANAGEMENT OPERATIONS

TECHNICAL FIELD

The present invention relates to evaluating management operations.

BACKGROUND OF THE INVENTION

Computer systems may include different resources used by one or more host processors. Resources and host processors in a computer system may be interconnected by one or more communication connections. These resources may include, for example, data storage devices such as those included in the data storage systems manufactured by EMC Corporation. These data storage systems may be coupled to one or more servers or host processors and provide storage services to each host processor. Multiple data storage systems from one or more different vendors may be connected and may provide common data storage for one or more host processors in a computer system.

A host processor may perform a variety of data processing tasks and operations using the data storage system. For example, a host processor may perform basic system I/O operations in connection with data requests, such as data read and write operations.

Host processor systems may store and retrieve data using a storage device containing a plurality of host interface units, disk drives, and disk interface units. The host systems access the storage device through a plurality of channels provided therewith. Host systems provide data and access control information through the channels to the storage device and the storage device provides data to the host systems also through the channels. The host systems do not address the disk drives of the storage device directly, but rather, access what appears to the host systems as a plurality of logical disk units. The logical disk units may or may not correspond to the actual disk drives. Allowing multiple host systems to access the single storage device unit allows the host systems to share data in the device. In order to facilitate sharing of the data on the device, additional software on the data storage systems may also be used.

It will be appreciated from the foregoing that these systems can be complex. One of the results of the complexity is that a management operation performed with respect to a system can sometimes have a negatively affect thereon. There is therefore a need to address this issue.

SUMMARY OF THE INVENTION

Described is a method and system for use in evaluating management operations. A current storage configuration in connection with a data storage system is captured. A management operation event relating to the data storage system is simulated without affecting the data storage system. The management operation event is simulated using the current storage configuration in connection with the data storage system. A management operation event output is provided for enabling evaluation of the potential affect of the management operation event in the data storage system in response to simulating the management operation.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION

Figure 1:
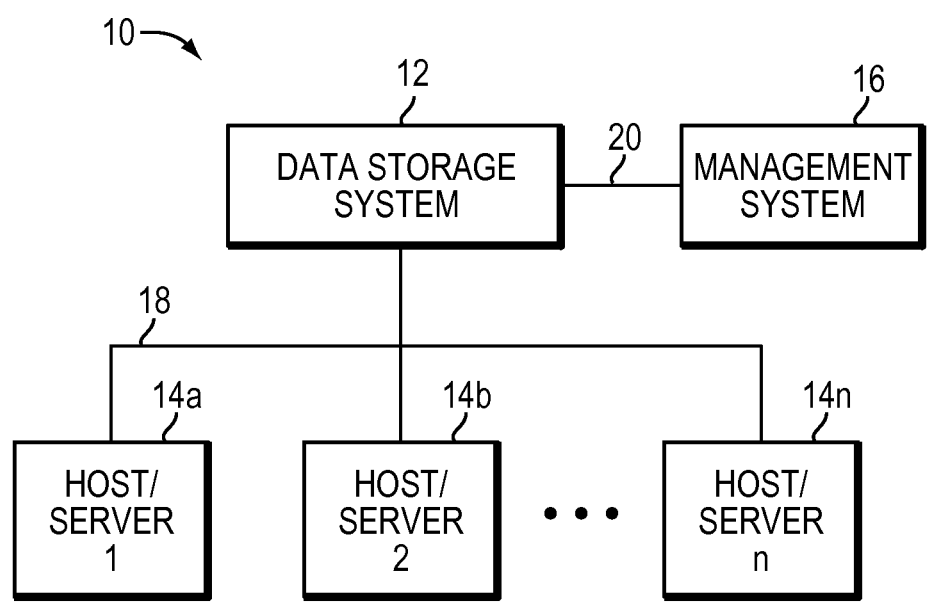
FIG. 1 is an example of a system that may utilize the technique described herein.

The invention can be implemented in numerous ways, including as a process, an apparatus, a system, a computer program embodied on a computer readable storage medium, and/or a processor, such as a processor configured to execute instructions stored on and/or provided by a memory coupled to the processor. In this specification, the implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Described below is a technique for use in evaluating management operations. The technique provides the ability to analyze and evaluate the affect of management operations offline without affecting a data storage system. This technique can significantly assist in reducing the number of poor management operations in connection with a data storage system as well as providing a good way to evaluate and validate the results of various management operations. The technique also enables management operations to be recorded which can be subsequently implemented in data storage system.

Before evaluation, the technique can load real data from a data storage system or a group of systems as a baseline. The administrator can then simulate any action offline without affecting the data storage system. If the administrator is satisfied with the management operation, they can implement the management operation in the data storage system or replay the recorded management operation in the data storage system which was previously simulated offline. Alternatively, the administrator can reject the management operation if they do not wish to use it.

One of the advantages of the technique is that the administrator can easily and safely evaluate and validate management operations without affecting the data storage system.

Referring to FIG. 1, there is illustrated an example of a system that may utilize the technique described herein. The system 10 includes one or more data storage systems 12 connected to server or host systems 14a-14n through communication medium 18. The system 10 also includes a management system 16 connected to one or more data storage systems 12 through communication medium 20. In this embodiment of the system 10, the management system 16, and the N servers or hosts 14a-14n may access the data storage systems 12, for example, in performing input/output (I/O) operations, data requests, and other operations. The communication medium 18 may be any one or more of a variety of networks or other type of communication connections as known to those skilled in the art. Each of the communication mediums 18 and 20 may be a network connection, bus, and/or other type of data link, such as a hardwire or other connections known in the art. For example, the communication medium 18 may be the Internet, an intranet, network or other wireless or other hardwired connection(s) by which the host systems 14a-14n may access and communicate with the data storage systems 12, and may also communicate with other components (not shown) that may be included in the computer system 10. In one embodiment, the communication medium 20 may be a LAN connection and the communication medium 18 may be an iSCSI or fibre channel connection.

Each of the host systems 14a-14n and the data storage systems 12 included in the system 10 may be connected to the communication medium 18 by any one of a variety of connections as may be provided and supported in accordance with the type of communication medium 18. Similarly, the management system 16 may be connected to the communication medium 20 by any one of variety of connections in accordance with the type of communication medium 20. The processors included in the host computer systems 14a-14n and management system 16 may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage systems 12 are described herein in more detail, and may vary with each particular embodiment. Each of the host computers 14a-14n, the management system 16 and data storage systems may all be located at the same physical site, or, alternatively, may also be located in different physical locations. In connection with communication mediums 18 and 20, a variety of different communication protocols may be used such as SCSI, Fibre Channel, iSCSI, and the like. Some or all of the connections by which the hosts, management system, and data storage system may be connected to their respective communication medium may pass through other communication devices, such as a Connectrix or other switching equipment that may exist such as a phone line, a repeater, a multiplexer or even a satellite. In one embodiment, the hosts may communicate with the data storage systems over an iSCSI or a Fibre Channel connection and the management system may communicate with the data storage systems over a separate network connection using TCP/IP. It should be noted that although FIG. 1 illustrates communications between the hosts and data storage systems being over a first connection, and communications between the management system and the data storage systems being over a second different connection, an embodiment may also use the same connection. The particular type and number of connections may vary in accordance with particulars of each embodiment.

Each of the host computer systems may perform different types of data operations in accordance with different types of tasks. In the embodiment of FIG. 1, any one of the host computers 14a-14n may issue a data request to the data storage systems 12 to perform a data operation. For example, an application executing on one of the host computers 14a-14n may perform a read or write operation resulting in one or more data requests to the data storage systems 12.

The management system 16 may be used in connection with management of the data storage systems 12. The management system 16 may include hardware and/or software components. The management system 16 may include one or more computer processors connected to one or more I/O devices such as, for example, a display or other output device, and an input device such as, for example, a keyboard, mouse, and the like. A data storage system manager may, for example, view information about a current storage volume configuration on a display device of the management system 16, provision data storage system resources, and the like.

In one embodiment, the data storage systems 12 may include one or more data storage systems such as one or more of the data storage systems, such as data storage arrays, offered by EMC Corporation of Hopkinton, Mass. Each of the data storage systems may include one or more data storage devices 13a-13n, such as disks. One or more data storage systems may be manufactured by one or more different vendors. Each of the data storage systems included in 12 may be inter-connected (not shown). Additionally, the data storage systems may also be connected to the host systems through any one or more communication connections that may vary with each particular embodiment and device in accordance with the different protocols used in a particular embodiment. The type of communication connection used may vary with certain system parameters and requirements, such as those related to bandwidth and throughput required in accordance with a rate of I/O requests as may be issued by the host computer systems, for example, to the data storage systems 12. It should be noted that each of the data storage systems may operate stand-alone, or may also be included as part of a storage area network (SAN) that includes, for example, other components such as other data storage systems. Each of the data storage systems may include a plurality of disk devices or volumes. The particular data storage systems and examples as described herein for purposes of illustration should not be construed as a limitation. Other types of commercially available data storage systems, as well as processors and hardware controlling access to these particular devices, may also be included in an embodiment.

In such an embodiment in which element 12 of FIG. 1 is implemented using one or more data storage systems, each of the data storage systems may include code thereon for performing the techniques as described herein.

Servers or host systems, such as 14a-14n, provide data and access control information through channels to the storage systems, and the storage systems may also provide data to the host systems also through the channels. The host systems may not address the disk drives of the storage systems directly, but rather access to data may be provided to one or more host systems from what the host systems view as a plurality of logical devices or logical volumes (LVs). The LVs may or may not correspond to the actual disk drives. For example, one or more LVs may reside on a single physical disk drive. Data in a single storage system may be accessed by multiple hosts allowing the hosts to share the data residing therein. An LV or LUN (logical unit number) may be used to refer to the foregoing logically defined devices or volumes.

Figure 2:
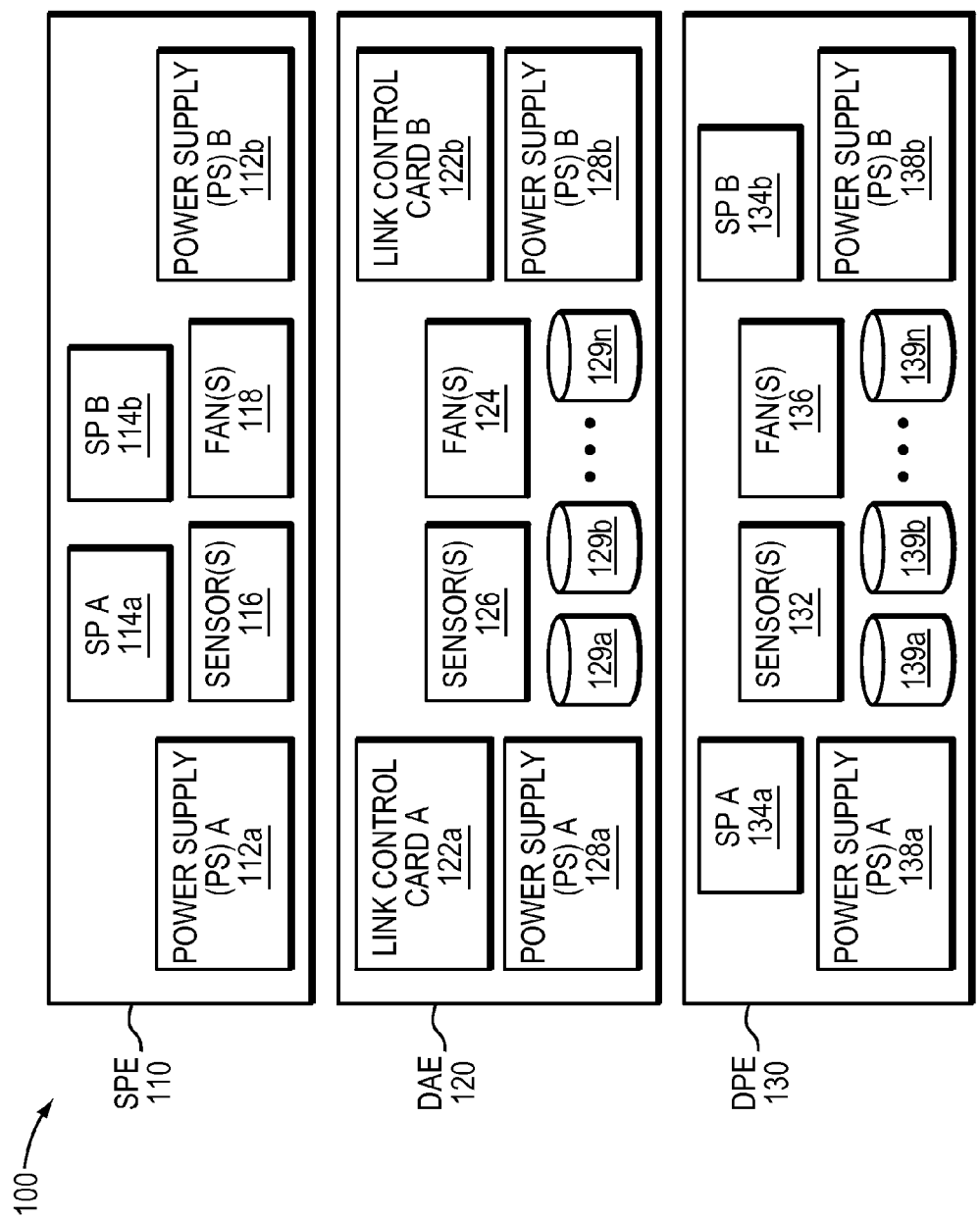
FIG. 2 is an example illustrating different enclosures and components thereof that may be included in the system of FIG. 1.

Referring to FIG. 2, there is illustrated an example of different types of enclosures that may be included in an embodiment of the system. The example 100 includes a storage processor enclosure (SPE) 110, a disk array enclosure (DAE) 120, and a disk array processor enclosure (DPE) 130. A data storage system may include, for example, an SPE and one or more DAEs, or a DPE and one or more DAEs.

An SPE 110 may include storage processors ("SPs") or central processing units ("CPUs) of the data storage system. In one embodiment, the SPE 110 may include two SPs denoted as SPs A and B (114a, 114b). The SPE 110 may also include two enclosure power supplies, power supply (PS) A 112a, PS B 112b, one or more sensors 116, and one or more fans 118. PS A 112a and PS B 112b may supply power to the components of the SPE 110. PS A 112a and PS B 112b may be powered by an external or primary power source, such as AC power provided by a source external with respect to the data storage system. The sensors 116 may include a temperature sensor that records the ambient temperature for the SPE 110. The SPE 110 may include other components than as illustrated in the example 100 for use with techniques herein.

A DAE 120 may include data storage devices of the data storage system. In one embodiment, the DAE 120 may include data storage devices 129a-129n, link control card (LCC) A 122a, LCC B 122b, one or more sensors 126, power supply (PS) A 128a, PS B 128b, and one or more fans 124. PS A 128a and PS B 128b may supply power to the components of the DAE 120. PS A 128a and PS B 128b may be powered by an external or primary power source, such as AC power provided by a source external with respect to the data storage system. The sensors 126 may include a temperature sensor that records the ambient temperature for the DAE 120. The DAE 120 may include other components than as illustrated in the example 100 for use with techniques herein. Each of the LCCs 122a, 122b may function as the interface between the components within the DAE and components outside or external to the DAE. Another enclosure, such as the SPE, may be connected to, and communicate with, the DAE through the LCCs 122a, 122b.

A DPE 130 may include storage processors ("SPs") or central processing units ("CPUs) and also storage devices of the data storage system. In one embodiment, the DPE 130 may include two SPs denoted as SPs A and B (134a, 134b). The DPE 130 may also include two enclosure power supplies, power supply (PS) A 138a, PS B 138b, one or more sensors 132, one or more fans 136, and data storage devices 139a-139n. PS A 134a and PS B 134b may supply power to the components of the DPE 130. PS A 134a and PS B 134b may be powered by an external or primary power source, such as AC power provided by a source external with respect to the data storage system. The sensors 132 may include a temperature sensor that records the ambient temperature for the DPE 130. The DPE 130 may include other components than as illustrated in the example 100 for use with techniques herein.

It should be noted that the one or more sensors of an enclosure may provide for obtaining one or more temperature measurements. As described above, a sensor may be used to record ambient temperature of air flowing into and/or surrounding the enclosure (e.g., indicative of the temperature of air external to the enclosure). A sensor may also be used to record the temperature within the enclosure. An embodiment may include one or more of the foregoing temperature sensors. Additionally, the power supplies within the enclosures illustrated in FIG. 2 may include an integrated sensor for sensing and reporting the amount of power utilized. However, an embodiment may alternatively include a power sensor as a separate sensor which is not integrated with the power supplies.

The data storage devices (e.g., denoted 129a-129n of the DAE 120 and 139a-139n of the DPE 130) may be any one or more types of data storage devices or drives having different data storage device characteristics. For example, in one embodiment, an enclosure may include FC (fibre channel) disk drives, SATA disk drives, or solid state drives (SSDs) such as flash-memory based storage drives. The number and/or type of devices included in an enclosure may also vary with the particular enclosure and/or embodiment.

In some embodiments, the data storage system may have two or more SPs. In one embodiment in which a data storage system has two SPs, the data storage system may include either the SPE or the DPE in combination with one or more DAEs. A DAE and a DPE may each have two enclosure power supplies and an SPE may have 2 or 4 enclosure level power supplies (although two are illustrated in elements 110 for exemplary purposes). As noted above, each such enclosure level power supply (PS) such as denoted by elements 112a, 112b, 128a, 128b, 138a and 138b, may be a primary power source such as AC power for components of the enclosure. Each PS of an enclosure may have two internal fans or blowers which are integrated with the PS as a single unit. Each enclosure may have 2-4 external fans. It should be noted that the foregoing numbers of components such as fans, CPUs or SPs, power supplies, and the like, are examples of what may be included in an embodiment in accordance with techniques herein.

In this embodiment, a SP or CPU of an SPE or DPE may connect to a DAE through an LCC of the DAE. The enclosures as illustrated may include replicate hardware components, such as two or more enclosure level power supplies, a DAE which includes two LCCs, an SPE or DPE including two SPs or CPUs, and the like. In an embodiment where an enclosure includes two SPs or CPUs, two LCCs and the like, a first of each of the pair may be denoted as the "A" components and a second of the pair may be denoted as the "B" components.

Figure 3:
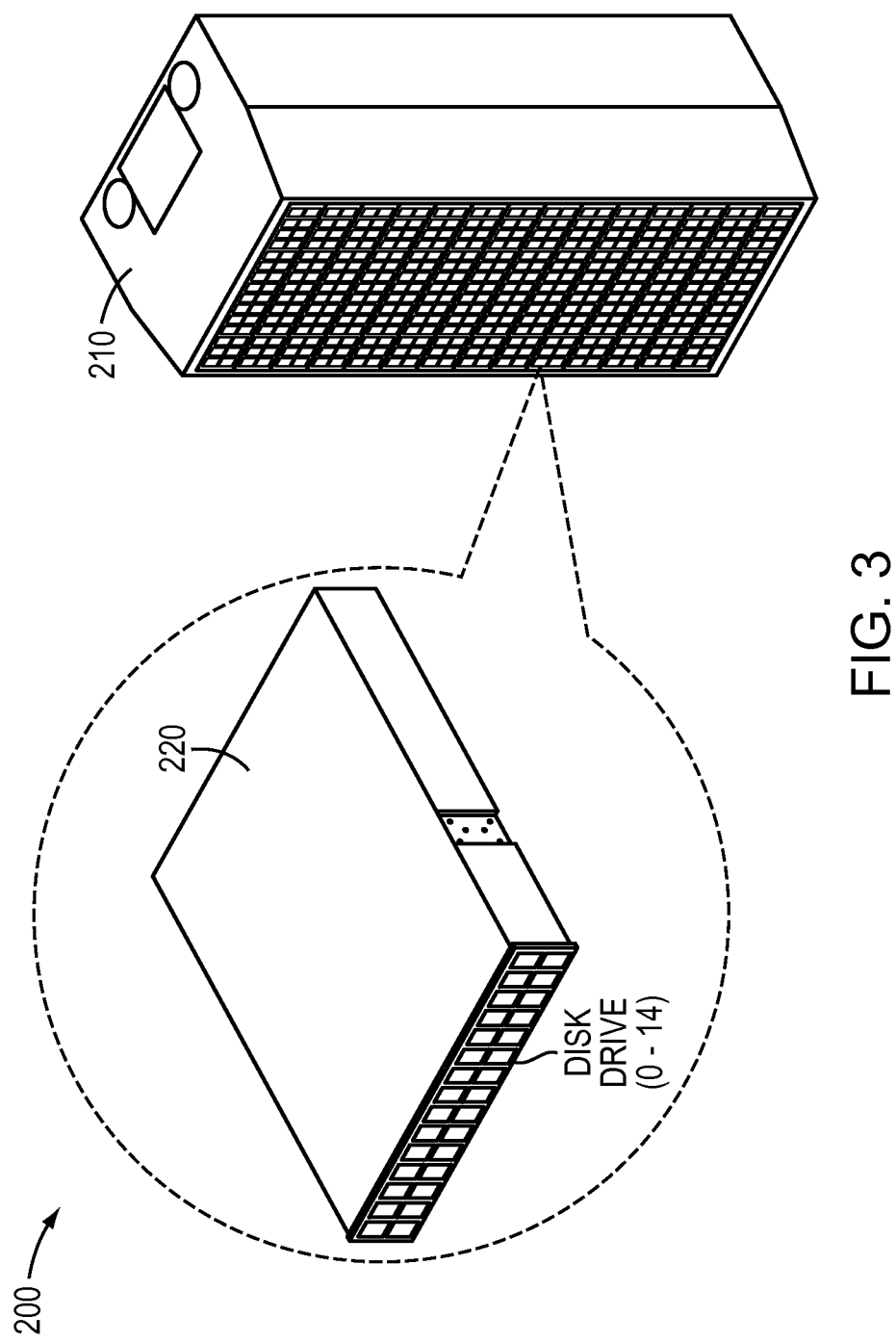
FIG. 3 is an example illustrating an arrangement of enclosures in a rackmount arrangement that may be included in the system of FIG. 1.

Referring to FIG. 3, there is illustrated an arrangement of enclosures in a rackmount arrangement that may be included in an embodiment of the system. The example 200 illustrates an exemplary rack mount configuration where the enclosures are included in racks in a rackmount cabinet 210. Each rack may include one of the enclosures such as illustrated by 220 where the enclosure may be a DAE illustrated as including disk drives 0-14. The different enclosures included in a data storage system may be connected to each other in a variety of different arrangements.

Figure 4:
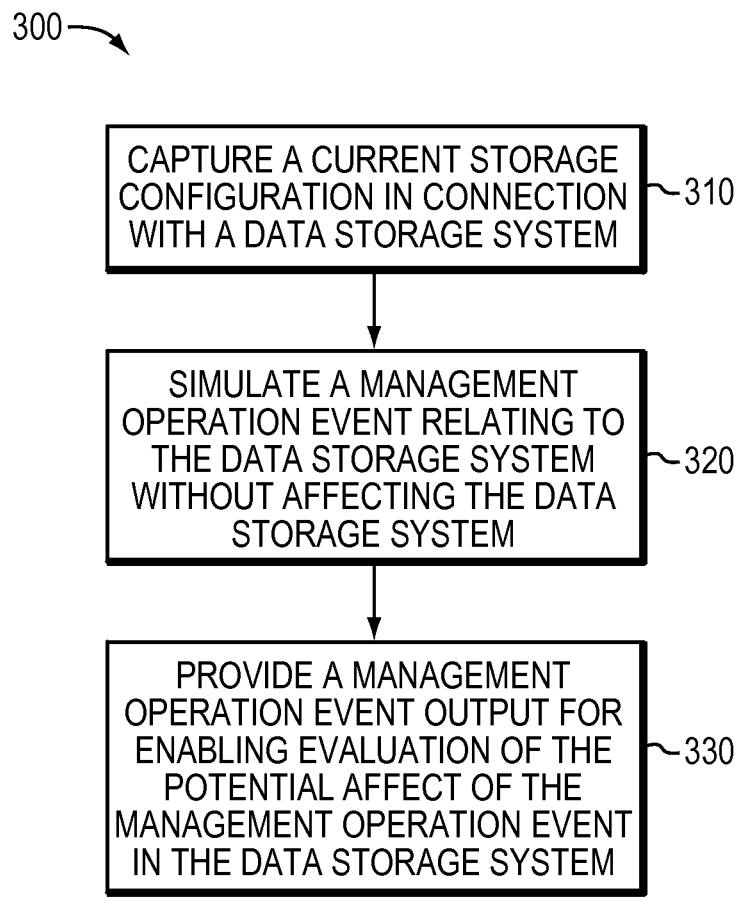
FIG. 4 is a flowchart summarizing the steps of the technique described herein.

Referring to FIG. 4, there is illustrated a flowchart summarizing a technique 300 for use in evaluating management operations. It will be appreciated from the description herein that the technique 300 may be used in connection with the system 10 such that the affect of management operations performed in connection with the data storage system 12 can initially be evaluated in the management system 16 without affecting the data storage system 12. For example, the management operations may include, without limitation, configuring and provisioning storage in the data storage system for use with a particular application; backing up, moving, reorganizing, protecting, analyzing, modifying, and repairing objects stored in the data storage system; and upgrading software associated with the data storage system. An administrator of the data storage system may simulate any one of these operations in the management system 16 using the current data storage system configuration so as to evaluate the affect of the management operation in connection with the data storage system 12 before performing the management operation in the data storage system.

The technique comprises capturing 310 a current storage configuration in connection with a data storage system 12. It will be appreciated that memory in the data storage system 12 can store the information relating to storage configuration. It will also be appreciated that in at least one embodiment the management system 16 can capture the current storage configuration from memory by requesting the information therefrom. In other words, the management system 16 can be configured for requesting the current storage configuration from memory of the data storage system 12. The management system 16 will in turn receive or collect or capture the information from the system 12. The information may include, without limitation, information relating to storage pool configurations, LUN configurations, application configurations, and the relationships therebetween. For example, the application configurations may include details regarding shared folders, e-mail applications, virtual applications and the like. The information may also include hardware information such as CPU details, memory details, data storage device details and the like in connection with the data storage system 12. For example, the data storage devices may be disk drives. It will also be understood that the technique may also capture further information such as information relating to deduplication, replication, tiering such as Fully Automated Storage Tiering (FAST) and the like. It will also be appreciated that when there is multiple data storage systems the data storage configuration data may also include relationships between systems.

The technique comprises simulating 320 a management operation event relating to the data storage system 12 without affecting the data storage system. In this embodiment, the management operation event can be simulated in the management system 16 using the captured current storage configuration in connection with the data storage system 12. For example, the management operation event may relate to the creation of a shared folder in the data storage system. The creation may be initiated by a user or administrator of the data storage system by making the necessary entry in the management system 16. However, the administrator may desire to evaluate the potential affect of the management operation event on the data storage system before actually implementing the management operation in the data storage system 12. The technique as described herein enables such evaluation.

The technique comprises providing 330 a management operation event output for enabling evaluation of the potential affect of the management operation event in the data storage system in response to simulating the management operation event. It will be appreciated that the management operation event output may enable evaluation of the potential affect of the management operation event on performance in the data storage system. The performance of the data storage system may include, without limitation, information relating to CPU utilization, data throughput, memory utilization, storage capacity, response time or a combination of performance metric in connection with the data storage system 12. This will be described in further detail below.

In accordance with an embodiment of the current technique, the management system 16 can provide the management operation event output on a graphical user interface (GUI) for enabling evaluation of the potential affect of the management operation in the data storage system. It will be appreciated that the GUI may comprise a graph for enabling evaluation of the potential affect of the management operation in the data storage system. Furthermore, as will be described below, the management operation event may overlay the management operation event output on the graph for enabling effortless evaluation of the potential affect of the management operation event in the data storage system.

It will also be appreciated by those skilled in the art that the technique as disclosed herein may also avail of information from system logs or the like that may track, for example, historical system performance pertaining to the storage system 12, the hosts 14a-14n, and the storage network as a whole. For example, the logs may comprise of metrics data related to CPUs, memory, and I/O resources associated with one or both of storage system 12 and hosts 14a-14n, and the storage devices of the storage system 12. The metrics data may be collected by hardware and software located on one or more of data storage system 12, management system 16, and hosts 14a-14n. It will also be appreciated that such metrics data may assist in providing the management operation event output for enabling evaluation of the potential affect of the management event operation in the data storage system in response to simulating the management operation.

In another embodiment, the management system 16 can be configured for recording the management operation event and transmitting the management operation event to the data storage system in response to successful evaluation of the affect of the management operation event in the data storage system. In a further embodiment, the management system can be configured for either deleting or editing the management operation event in response to either an unsuccessful evaluation or a partially unsuccessful evaluation of the affect of the management operation event in the data storage system.

Figure 5:
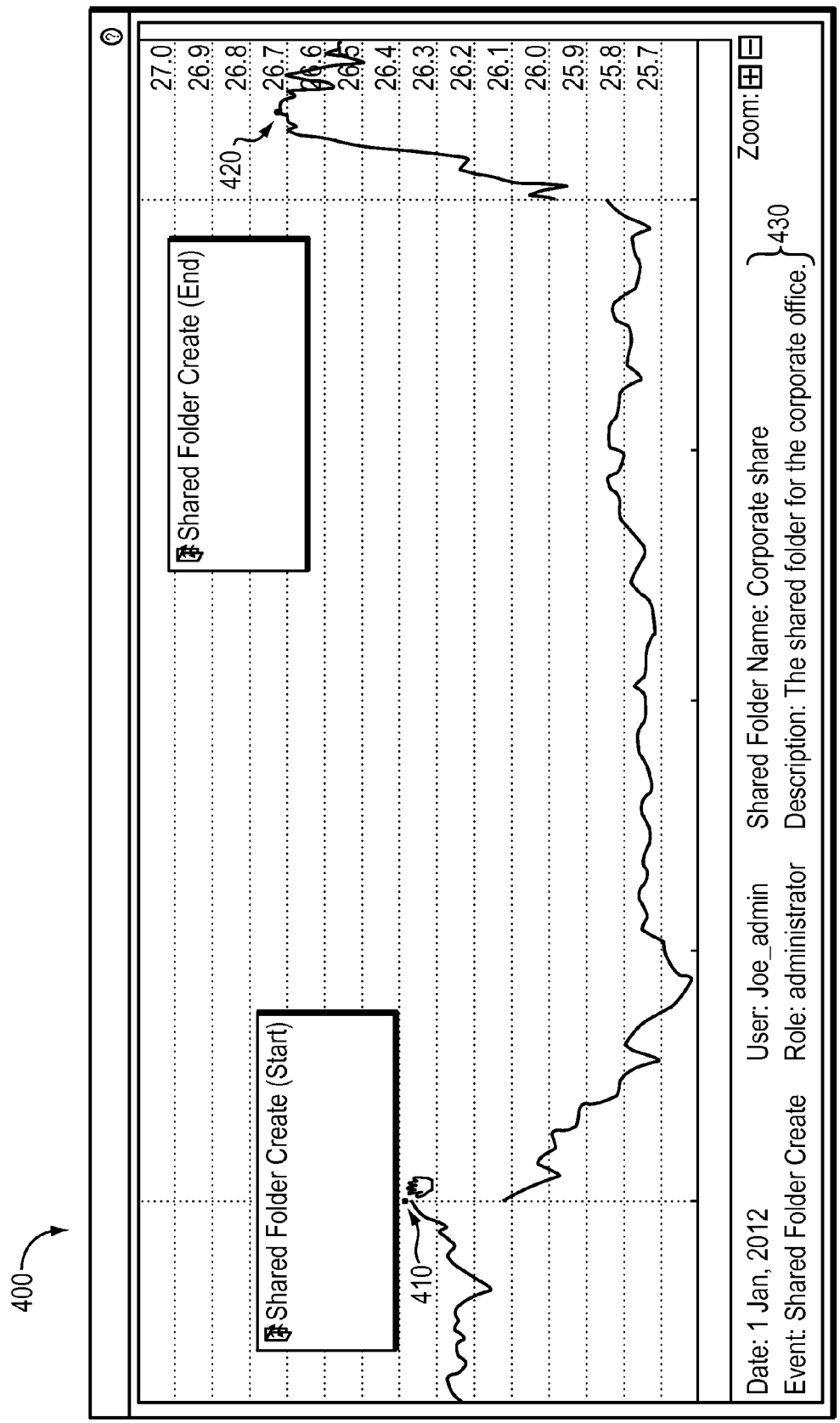
FIG. 5 is an example graphical user interface for evaluating the affect of management operations in accordance with an embodiment of the technique described herein.

Referring to FIG. 5, there is illustrated an example graphical user interface 400 in accordance with at least one embodiment of the current technique. In this embodiment, the management operation event output is provided on the graphical user interface 400 enabling evaluation of the affect of a management operation event on performance in the data storage system over a time period using a line graph. The x-axis may represent time and the y-axis may represent data throughput. Different time units and different performance metrics may be used for the x- and y-axis, respectively. For example, the y-axis may represent, for example, CPU utilization, memory utilization, storage capacity, response time or a combination of performance metrics.

It will be appreciated from the figure that the management operation event may be correlated with and overlay management operation event output. For example, in this embodiment, point 410 indicates a point in time at which a user initiates a management operation event such as the creation of a shared folder and point 420 indicates a point in time at which the management operation event is completed. The management operation event overlaying the management operation event output may enable a user to more easily determine how particular management operation events affect the data storage system. For example, after an inspection of the interface 400, a user may notice that the throughput may decline over a period of time following the initiation of the shared folder creation operation, as indicated by point 410, and that the throughput may improve soon before the management operation event completes and maintains steady following completion of the management operation event, as can be seen by point 420. In some embodiments, a user of the interface 400 may be presented with information in area 430 including the date, the user role, who initiated the operation, and a brief description of the operation.

While the above example illustrates and describes the management operation event as the creation of a shared folder, it will be readily apparent to those skilled in the art that the management operation event may not be limited to such operations. For example, in another embodiment, an administrator of a data storage system may require one thousand email boxes with each mail box having at least 20 GB. It will be appreciated that the administrator of the data storage system may have a plurality of options available in order to meet the above requirement. However, the administrator may wish to evaluate the affect of these options before actually implementing any management operation in the data storage system. For example, the administrator may have three options, as follows:

1. Create one thousand logical volumes with fixed 20 GB and create one email box for each volume
2. Create one thousand logical volumes with thin-provisioning enabled and create one email box on each volume
3. Create a huge logical volume with fixed 20 TB and create a one thousand email boxes on that volume It will be appreciated that the data storage system may react to each of the above management operations differently depending on the current storage configuration of the data storage system. The technique as described herein enables the administrator to evaluate the affect of each management operation event (i.e., 1 to 3 above) before taking a decision that may affect the data storage system. It will be evident to those skilled in the art from the foregoing that the affect on the data storage system of the management operation is dependent on the current storage configuration in the data storage system.

An advantage of the above is that the technique ensures that the daily usage of the data storage system is not interrupted as the evaluation of the affect of each management operation is carried out offline on the management system. For example, if the data storage system was in use and had heavy IO, each operation may require several hours meaning nearly half a day may be expended attempting to decide which operation to implement on a real system.

While the above describes the management operation event output enabling evaluation of the affect of a management operation event on performance in the data storage system, it will be apparent to those skilled in the art that performance is only one of the evaluation elements. In one embodiment, the management operation event output may enable evaluation of the affect of a management operation event on serviceability. For example, if the management operation event was to remove a storage pool, the operation may cause all shared folders, LUNs, etc which are built on that pool to be also removed. This may result in customer services which are built on those items to be also removed. It will be appreciated that all the relationships among pools, LUNs, services and the like may be stored in configuration data. In another embodiment, the management operation event output may enable evaluation of the affect of a management operation event on reliability. For example, the management operation of migrating a performance pool to a capacity pool can lower the ability to withstand risks as a performance pool has better reliability. In a further embodiment, the management operation event output may enable evaluation of the affect of a management operation event on availability. For example, the management operation of disabling a recovery-conscious strategy in a single storage system can, for example, remove snapshot LUNs which may result in customers not finding historic data.

While the management system has been described in detail with respect to FIG. 1, it may in some embodiments be implemented as a mobile portable management device such that users can continue their work when, for example, on a plane or out of the office.

While the invention has been disclosed in connection with preferred embodiments shown and described in detail, their modifications and improvements thereon will become readily apparent to those skilled in the art. For example, the technique described herein may be applied to any computer system. Accordingly, the spirit and scope of the present invention should be limited only by the following claims.

What is claimed is:

1. A method for use in evaluating management operations, the method comprising:
   capturing current data in connection with a data storage system, wherein the current data comprises physical and logical configuration information in connection with physical and logical features in the data storage system;
   simulating offline a management operation event relating to the data storage system, wherein the management operation event is simulated using the current data in connection with the data storage system;
   based on the simulation, providing a visual representation of a management operation event output for enabling evaluation of the management operation event;
   recording the management operation event;
   providing an opportunity to select the management operation event; and
   in response to the selection of the management operation event, communicating with the data storage system in a manner that enables the automatic replay of the management operation event online in the data storage system;
   wherein the method is configured to reveal, via the management operation event output, an impact of the management operation event on performance in connection with the data storage system, wherein performance relates to any of CPU utilization, memory utilization, storage capacity, data throughput, response time, CPU utilization, memory utilization, storage capacity, data throughput and response time;
   further wherein the method is configured to reveal, via the management operation event output, an impact of the management operation event on services in the event of the management operation event removing any logical or physical feature in connection with the data storage system;
   further wherein the method is configured to reveal, via the management operation event output, an impact of the management operation event on reliability in the event of the management operation event migrating from one resource to another resource;
   further wherein the method is configured to reveal, via the management operation event output, an impact of the management operation event on availability in the event that the management operation event disables a feature in connection with the data storage system.

2. The method as claimed in claim 1, wherein the management operation event output is provided on a graphical user interface for enabling evaluation of the management operation event.

3. The method as claimed in claim 2, wherein the graphical user interface comprises a graph for enabling evaluation of the management operation event.

4. The method as claimed in claim 3, wherein the management operation event overlays the management operation event output on the graph.

5. The method as claimed in claim 1, wherein the current data comprises information relating to storage configuration selected from the group consisting of:
   storage pool configurations
   LUN configurations
   application configurations
   CPU details
   memory details
   data storage device details.

6. The method as claimed in claim 1, wherein the management operation event relates to a management operation selected from the group consisting of:
   configuring storage in a data storage system
   backing up, moving, reorganizing, protecting, analyzing, modifying, and repairing objects stored in a data storage system
   upgrading software in a data storage system.

7. The method as claimed in claim 1, wherein the method is configured for evaluating management operation events using a management system for managing the data storage system.

8. The method as claimed in claim 7, wherein the management system comprises a portable mobile device.

9. A system for use in evaluating management operations, the system comprising:
   a processor and memory;
   the system configured to:
   capture current data in connection with a data storage system, wherein the current data comprises physical and logical configuration information in connection with physical and logical features in the data storage system;
   simulate offline a management operation event relating to the data storage system, wherein the management operation event is simulated using the current data in connection with the data storage system;
   based on the simulation, provide a visual representation of a management operation event output for enabling evaluation of the management operation event;
   record the management operation event;
   provide an opportunity to select the management operation event; and
   in response to the selection of the management operation event, communicate with the data storage system in a manner that enables the automatic replay of the management operation event online in the data storage system;
   wherein the system is configured to reveal, via the management operation event output, an impact of the management operation event on performance in connection with the data storage system, wherein performance relates to any of CPU utilization, memory utilization, storage capacity, data throughput, response time, CPU utilization, memory utilization, storage capacity, data throughput and response time;
   further wherein the system is configured to reveal, via the management operation event output, an impact of the management operation event on services in the event of the management operation event removing any logical or physical feature in connection with the data storage system;
   further wherein the system is configured to reveal, via the management operation event output, an impact of the management operation event on reliability in the event of the management operation event migrating from one resource to another resource;
   further wherein the system is configured to reveal, via the management operation event output, an impact of the management operation event on availability in the event that the management operation event disables a feature in connection with the data storage system.

10. The system as claimed in claim 9, wherein the management operation event output is provided on a graphical user interface for enabling evaluation of the management operation event.

11. The system as claimed in claim 10, wherein the graphical user interface comprises a graph for enabling evaluation of the management operation event.

12. The system as claimed in claim 11, wherein the management operation event overlays the management operation event output on the graph.

13. The system as claimed in claim 9, wherein the current data comprises information relating to storage configuration selected from the group consisting of:
   storage pool configurations
   LUN configurations
   application configurations
   CPU details
   memory details
   data storage device details.

14. The system as claimed in claim 9, wherein the management operation event relates to a management operation selected from the group consisting of:
   configuring storage in a data storage system
   backing up, moving, reorganizing, protecting, analyzing, modifying, and repairing objects stored in a data storage system
   upgrading software in a data storage system.

15. The system as claimed in claim 9, wherein the system is configured for evaluating management operation events using a management system for managing the data storage system.

16. The system as claimed in claim 15, wherein the management system comprises a portable mobile device.

* * * * *